(12) United States Patent
Xu et al.

(10) Patent No.: US 11,476,296 B2
(45) Date of Patent: *Oct. 18, 2022

(54) DOUBLE COLOR MICRO LED DISPLAY PANEL

(71) Applicant: HONG KONG BEIDA JADE BIRD DISPLAY LIMITED, Hong Kong (HK)

(72) Inventors: Quchao Xu, Hong Kong (HK); Qiming Li, Hong Kong (HK)

(73) Assignee: HONG KONG BEIDA JADE BIRD DISPLAY LIMITED, Hong Kong (CN)

( * ) Notice: Subject to any disclaimer, the term of this patent is extended or adjusted under 35 U.S.C. 154(b) by 0 days.

This patent is subject to a terminal disclaimer.

(21) Appl. No.: 17/007,480

(22) Filed: Aug. 31, 2020

(65) Prior Publication Data
US 2022/0068994 A1    Mar. 3, 2022

(51) Int. Cl.
*H01L 29/20* (2006.01)
*H01L 33/00* (2010.01)
*H01L 27/15* (2006.01)
*H01L 25/075* (2006.01)
*H01L 25/16* (2006.01)
*H01L 33/62* (2010.01)
*H01L 33/44* (2010.01)
*H01L 33/58* (2010.01)
*H01L 33/60* (2010.01)
*H01L 33/42* (2010.01)

(52) U.S. Cl.
CPC .......... *H01L 27/15* (2013.01); *H01L 25/0753* (2013.01); *H01L 25/167* (2013.01); *H01L 33/42* (2013.01); *H01L 33/44* (2013.01); *H01L 33/58* (2013.01); *H01L 33/60* (2013.01); *H01L 33/62* (2013.01)

(58) Field of Classification Search
CPC ......... H01L 27/15; H01L 33/58; H01L 33/62; H01L 33/44; H01L 33/60; H01L 25/167; H01L 25/0753; H01L 33/42
See application file for complete search history.

(56) References Cited

U.S. PATENT DOCUMENTS

| | | | |
|---|---|---|---|
| 2013/0126825 A1* | 5/2013 | Walter | H01L 33/38 438/22 |
| 2016/0005921 A1* | 1/2016 | Suchalkin | G01N 21/314 257/13 |
| 2020/0144469 A1* | 5/2020 | Yang | H01L 33/44 |
| 2020/0395510 A1* | 12/2020 | Bower | H01L 27/156 |

(Continued)

Primary Examiner — Ismail A Muse
(74) Attorney, Agent, or Firm — Rosenberg, Klein & Lee (57) ABSTRACT

The present invention discloses a double color micro LED display panel including a plurality of pixels. Each of the pixels includes a substrate, a first semiconductor layer configured on the substrate, a second semiconductor layer configured on the first semiconductor layer, and a third semiconductor layer configured between the first semiconductor layer and the second semiconductor layer. The first semiconductor layer and the second semiconductor layer are N type, and the third semiconductor layer is P type. The first semiconductor layer and the third semiconductor layer form a first light emitting diode to emit a first light, and the second semiconductor layer and the third semiconductor layer form a second light emitting diode to emit a second light.

15 Claims, 10 Drawing Sheets

(56) References Cited

U.S. PATENT DOCUMENTS

| | | | |
|---|---|---|---|
| 2021/0074882 A1* | 3/2021 | Wang | H01L 33/08 |
| 2022/0068898 A1* | 3/2022 | Xu | H01L 27/156 |
| 2022/0068994 A1* | 3/2022 | Xu | H01L 33/44 |
| 2022/0068995 A1* | 3/2022 | Xu | H01L 33/46 |
| 2022/0068996 A1* | 3/2022 | Xu | H01L 27/156 |
| 2022/0068997 A1* | 3/2022 | Xu | H01L 27/156 |

* cited by examiner

DOUBLE COLOR MICRO LED DISPLAY PANEL

BACKGROUND OF THE INVENTION

1. Field of the Invention

The present invention relates to a display panel, and more particularly, to a double color micro LED display panel including two light emitting diodes which emit lights with different colors in one pixel.

2. Description of the Prior Art

In recent years, Mini LED and Micro LED technologies have been well developed, and LED panels are commonly applied to consumer devices and applications such as augmented reality (AR), projection, heads up display (HUD), and mobile device displays, wearable device displays, and automotive displays. With the improvement of people's quality of life, the devices and applications require LED panels with improved resolution and brightness. For example, an AR display integrated within a goggle and positioned close to a wearer's eyes can have a dimension of the fingernail while still demanding an HD definition (1280× 720 pixels) or higher.

With the requirement for miniaturization and portability of electronic devices, the size of the LED panels is also limited. It means that the size of each pixel of the LED panel is decreased when the LED panel has high resolution. When the size of the pixel is smaller, the light output area of the pixel is also decreased. Moreover, light is emitted in multiple directions, so the pixel can only emit part of the light, thereby reducing the light output rate. Furthermore, the distance among the pixels is also decreased when the LED panel has high resolution. That is to say, the light emitted from one pixel is easier to transmit to another pixel of the LED panel to cause the light crosstalk, thereby decreasing the display efficiency.

In addition, it is increasingly important for a light emitting device to integrate a plurality of various types of light emitting transistors and multi-color light emitting pixel units. In the prior art, the multi-color light emitting pixel includes a plurality of light emitting regions for emitting different types of lights respectively. Because the aligning processes and transferring processes are complex, the conventional process of fabricating the different types of light emitting regions becomes increasingly difficult, thereby leading to problems such as decreased alignment accuracy, decreased yield, and increased cost.

Generally speaking, at least red, green and blue colors are superimposed to reproduce a broad array of colors. In some instances, the pixel includes three monochromatic LEDs emitting red, green and blue colors respectively, and the monochromatic LEDs are fabricated at different non-overlapping zones in the pixel. The existing technology faces the challenges to improve the effective emitting area within each pixel when the distance between the adjacent LEDs is determined. On the other hand, when a single LED emitting area is determined, further improving the overall resolution of the LED panel can be a difficult task because LEDs with different colors have to occupy their designated zones within the single pixel.

Thus, it is necessary to provide an LED structure for display panels to solve the above-mentioned drawbacks.

SUMMARY OF THE INVENTION

Therefore, the present invention is to provide a double color micro LED display panel including a plurality of pixels. Each of the pixels includes a substrate, a first semiconductor layer, a second semiconductor layer and a third semiconductor layer. The first semiconductor layer is configured on the substrate, the second semiconductor layer is configured on the first semiconductor layer, and the third semiconductor layer is configured between the first semiconductor layer and the second semiconductor layer. The first semiconductor layer and the second semiconductor layer are N type, and the third semiconductor layer is P type. The first semiconductor layer and the third semiconductor layer form a first light emitting diode to emit a first light, and the second semiconductor layer and the third semiconductor layer form a second light emitting diode to emit a second light.

Wherein, the wavelength of the first light is different from that of the second light.

Furthermore, the first light and the second light are selected from two of red, blue, yellow, green, orange, cyan and purple lights.

Wherein, each of the pixels includes an insulation layer. The insulation layer covers the top surface and side wall of the second semiconductor layer, the side wall of the first semiconductor layer and the third semiconductor layer, and the surface of the substrate. A portion of the third semiconductor layer is exposed from the insulation layer, and the insulation layer extends to the position between two of the pixels.

Wherein, each of the pixels includes a top conductive layer configured on the insulation layer and electrically connected to the exposed third semiconductor layer. The conductive layer extends to the position between two of the pixels.

Wherein, the double color micro LED display panel further includes a plurality of first conductive pads respectively configured on the top conductive layer between two of the pixels and electrically connected to the third semiconductor layer through the top conductive layer.

In one embodiment, the double color micro LED display panel further includes a plurality of reflective components respectively disposed on the first conductive pads and configured to reflect the first light and the second light to a certain direction.

In one embodiment, the double color micro LED display panel further includes a plurality of optical isolation components respectively disposed on the first conductive pads and configured to block the first light and the second light emitted from one of the pixels to the other of the pixels.

Wherein, each of the pixels includes a second conductive pad and a first connecting structure. The second conductive pad is configured on the substrate, and the first connecting structure is electrically connected to the second semiconductor layer and the second conductive pad.

Wherein, each of the pixels includes a third conductive pad configured on the substrate and a bonding layer configured between the substrate and the first semiconductor layer. The bonding layer is electrically connected to the first semiconductor layer and the third conductive pad.

Furthermore, the double color micro LED display panel further includes a plurality of pixels drivers respectively configured on the substrate of the pixels. The pixel driver is electrically connected to the second conductive pad and the third conductive pad and controls the first light emitting diode and the second light emitting diode to emit lights respectively.

In one embodiment, the double color micro LED display panel further includes a plurality of first conductive pads respectively coupled to the third semiconductor layer of the pixels and a plurality of pixel drivers respectively configured on the substrate of the pixels. The pixel driver is electrically connected to the first conductive pad, the second conductive pad and the third conductive pad, and the pixel driver controls the first light emitting diode and the second light emitting diode to emit lights respectively.

In one embodiment, the double color micro LED display panel further includes a plurality of reflective components respectively disposed on the insulation layer between two of the pixels and configured to reflect the first light and the second light to a certain direction.

In one embodiment, the double color micro LED display panel further includes a plurality of optical isolation components respectively disposed on the insulation layer between two of the pixels and configured to block the first light and the second light emitted from one of the pixels to the other of the pixels.

In one embodiment, each of the pixels includes a first conductive pad, a second conductive pad, a first connecting structure and a second connecting structure. The first conductive pad and the second conductive pad are configured on the substrate. The first connecting structure is electrically connected to the second semiconductor layer and the second conductive pad, and the second connecting structure is electrically connected to the third semiconductor layer and the first conductive pad.

Wherein, each of the pixels includes a third conductive pad configured on the substrate and a bonding layer configured between the substrate and the first light emitting diode. The bonding layer is electrically connected to the first semiconductor layer and the third conductive pad.

Furthermore, the double color micro LED display panel further includes a plurality of pixel drivers respectively configured on the substrate of the pixels. The pixel driver is electrically connected to the first conductive pad, the second conductive pad and the third conductive pad, and the pixel driver controls the first light emitting diode and the second light emitting diode to emit lights respectively.

Wherein, the area of the first light emitting diode is larger than that of the second light emitting diode.

In summary, the double color micro LED display panel of the present invention can include two light emitting diodes which emit different colors in one pixel, thereby increasing the light emitting efficiency and reducing the volume. The reflective component and the optical isolation component can effectively block the light emitted from one pixel to another of pixels to reduce the light crosstalk, thereby increasing the display efficiency and the resolution. Moreover, the reflective component can reflect the lights to increase the light output rate, which improves the display efficiency.

DETAILED DESCRIPTION OF THE INVENTION

A detailed description of the hereinafter described embodiments of the disclosed apparatus and method are presented herein by way of exemplification and not limitation with reference to the Figures. Although certain embodiments are shown and described in detail, it should be understood that various changes and modifications may be made without departing from the scope of the appended claims. The scope of the present invention will in no way be limited to the number of constituting components, the materials thereof, the shapes thereof, the relative arrangement thereof, etc., and are disclosed simply as an example of embodiments of the present invention.

Figure 1:
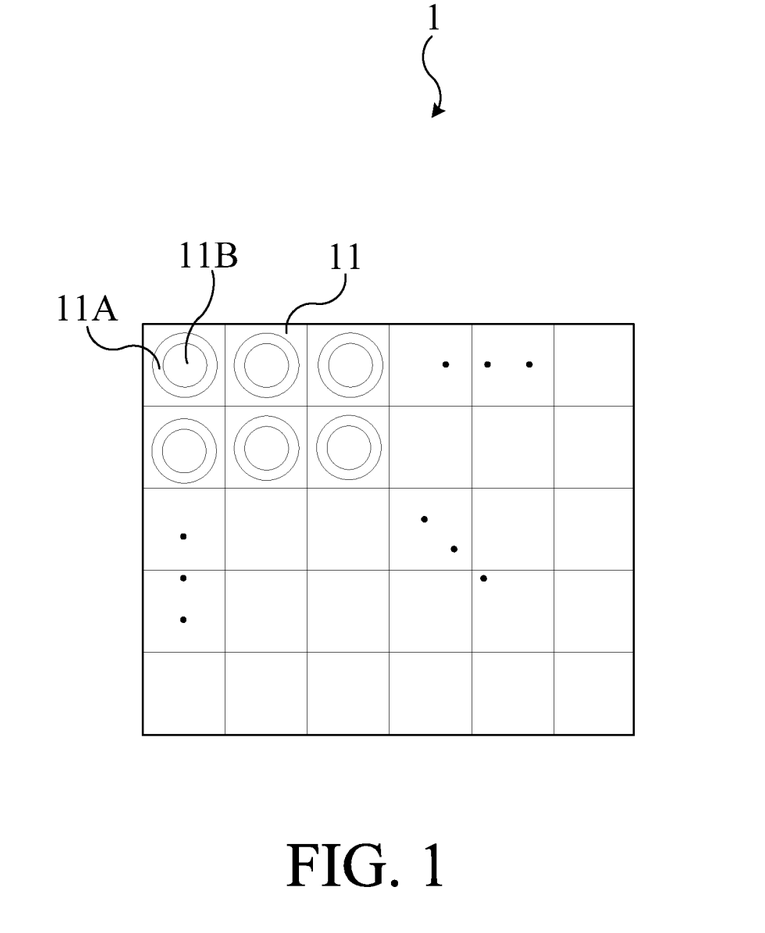
FIG. 1 is a schematic diagram illustrating a double color micro LED display panel according to an embodiment of the present invention.
Figure 2:
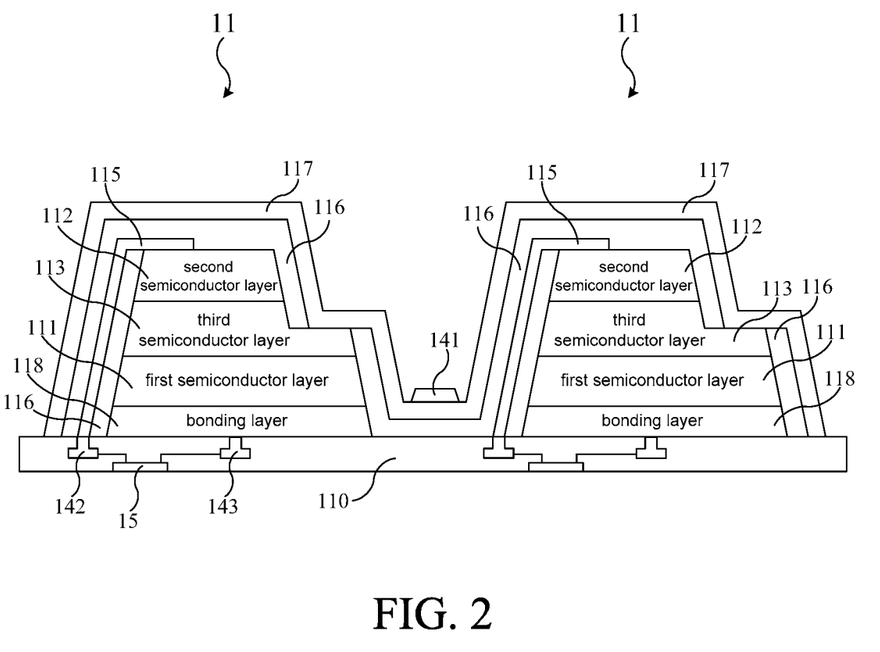
FIG. 2 is a cross-sectional diagram illustrating the two pixels of the double color micro LED display panel in FIG. 1.

Please refer to FIG. 1 and FIG. 2. FIG. 1 is a schematic diagram illustrating a double color micro LED display panel 1 according to an embodiment of the present invention. FIG. 2 is a cross-sectional diagram illustrating the two pixels 11 of the double color micro LED display panel 1 in FIG. 1. In this embodiment, the double color micro LED display panel 1 includes a plurality of pixels 11. Each of the pixels 11 includes a substrate 110, a first semiconductor layer 111, a second semiconductor layer 112 and a third semiconductor layer 113. The first semiconductor layer 111 is configured on the substrate 110, the second semiconductor layer 112 is configured on the first semiconductor layer 111, and the third semiconductor layer 113 is configured between the first semiconductor layer 111 and the second semiconductor layer 112. The first semiconductor layer 111 and the second semiconductor layer 112 are N type, and the third semiconductor layer 113 is P type. The first semiconductor layer 111 and the third semiconductor layer 113 form a first light emitting diode 11A to emit a first light, and the second semiconductor layer 112 and the third semiconductor layer 113 form a second light emitting diode 11B to emit a second light.

In practice, the double color micro LED display panel 1 can be applied to the screens of display devices. The plurality of pixels 11 of the double color micro LED display panel 1 can be arranged in an array. The first semiconductor layer 111, the third semiconductor layer 113 and the second semiconductor layer 112 are sequentially stacked on the substrate 110. For convenience, "top" means away from the substrate 110, "bottom" means toward the substrate 110, and the directional terms such as up, down, above, below, under etc. are interpreted accordingly.

The first semiconductor layer 111, the second semiconductor layer 112 and the third semiconductor layer 113 can be epitaxial layers formed by epitaxial growth, such as chemical vapor deposition (CVD), vapor phase epitaxy (VPE), liquid phase epitaxy (LPE) or solid phase epitaxy (SPE). Moreover, the first semiconductor layer 111 and the second semiconductor layer 112 can be N type epitaxial layers, and the third semiconductor layer 113 can be P type epitaxial layers. Therefore, the first semiconductor layer 111 and the third semiconductor layer 113 form the first light emitting diode 11A, and the second semiconductor layer 112 and the third semiconductor layer 113 form the second light emitting diode 11B. It means that the first light emitting diode 11A and the second light emitting diode 11B share the same P type semiconductor layer. Furthermore, the first light emitting diode 11A is located at the bottom of the pixel 11, and the second light emitting diode 11B is located at the top of the pixel 11. In one embodiment, the pixel 11 further includes a first multiple quantum well layer (MQW) and a second MQW layer (not shown in the figure). The first MQW layer is disposed between the first semiconductor layer 111 and the third semiconductor layer 113, and the second MQW layer is disposed between the second semiconductor layer 112 and the third semiconductor layer 113. In practice, the first MQW layer and the second MQW layer also can be epitaxial layers by epitaxial growth, to increase the light strength of the first light and the second light emitted from the first light emitting diode 11A and the second light emitting diode 11B.

In practice, the substrate 110 can be, but not limited to, a Si substrate, and the substrate 110 also can be a sapphire substrate, or a transparent substrate such as a glass substrate. The material of the substrate 110 also may be selected from one of InP, SiC and ZnO. The material of the first semiconductor layer 111, the second semiconductor layer 112 and the third semiconductor layer 113 can be GaN, AlGaN, AlInGaN, GaP, GaAs, but it is not limited herein. The first light emitted from the first light emitting diode 11A and the second light emitted from the second light emitting diode 11B can be selected from a range of different colors from a wavelength of 380 nm to 700 nm in visible color range. Furthermore, the first light and the second light can be selected from two of red, blue, yellow, green, orange, cyan and purple lights. For example, the first semiconductor layer 111 is N type GaN layer to emit blue light, the second semiconductor layer 112 is N type GaN layer to emit green light, and the third semiconductor layer 113 is P type GaN layer. Therefore, the first light emitting diode 11A can emit blue light and the second light emitting diode 11B can emit green light. Moreover, the first light and the second light also can be selected from invisible ranges such as ultra-violet and infrared.

In this embodiment, the cross-sectional area of the first semiconductor layer 111, the third semiconductor layer 113 and the second semiconductor layer 112 decreases from the bottom layer to the top layer. In practice, the configuration of those layers of the pixel 11 will improve the electronic connections between the individual LED structures and the electrodes, which simplifies the fabrication process. For example, the lower layer is exposed from the upper layer for easy connection. Moreover, the area of the first light emitting diode 11A can be larger than that of the second light emitting diode 11B. It means that the second light emitting diode 11B only covers a part of the first light emitting diode 11A. Therefore, the other uncovered portion of the first light emitting diode 11A can emit the first light directly, thereby increasing the light output rate.

In this embodiment, the pixel 11 further includes an insulation layer 116. The insulation layer 116 covers the top surface and side wall of the second semiconductor layer 112, the side wall of the first semiconductor layer 111 and the third semiconductor layer 113, and the surface of the substrate 110. Furthermore, a portion of third semiconductor layer 113 is exposed from the insulation layer 116, and the insulation layer 116 also extends to the position between two of the pixels. In practice, the material of the insulation layer 116 can be dielectric thin-film materials such as SiNx and SiO2, or polymeric material such as polyamide (PA). Furthermore, the insulation layer 116 may be transparent. The insulation layer 116 can be formed on the pixel 11 by pasting, coating or CVD. Therefore, the insulation layer 116 prevents the semiconductor layer 111, the second semiconductor layer 112 and the third semiconductor layer 113 from causing a short circuit. The exposed portion of the third semiconductor layer 113 can be formed by etching the insulation layer 116. Furthermore, as shown in FIG. 2, the exposed portion can be the top surface of the third semiconductor layer 113. In practice, the exposed portion can be formed by etching the second light emitting layer 112 and part of the third semiconductor layer 113 as a stair shape, then disposing the insulation layer 116 on the layers, and then removing the insulation layer 116 located on the exposed portion of the third semiconductor layer 113.

In this embodiment, the pixel 11 further includes a top conductive layer 117. The top conductive layer 117 is configured on the insulation layer 116, and extends to the position between the pixels 11. In practice, the material of the top conductive layer 117 can be Indium Tin Oxide (ITO), and the top conductive layer 117 can be formed on the insulation layer 116 commonly by vapor deposition. Furthermore, the top conductive layer 117 may be transparent. The top conductive layer 117 is configured to maintain a good conductivity for electrode connection. In this embodiment, when the top conductive layer 117 is disposed on the pixel 11, the top conductive layer 117 contacts and electrically connects to the exposed portion of the third semiconductor layer 113. Furthermore, the top conductive layer 117 can connect the exposed portion of the third semiconductor layer 113 of all pixels in series. It should be noted that the insulation layer 116 and the top conductive layer 117 not only cover two pixels 11 in FIG. 2, but also can extend to cover other pixels.

In this embodiment, the double color micro LED display panel 1 includes a plurality of first conductive pads 141, and each of the pixels includes a second conductive pad 142 and a first connecting structure 115. The first conductive pads 141 are respectively configured on the top conductive layer 117 between two of the pixels and electrically connected to the third semiconductor layer 113 through the top conductive layer 117. The second conductive pad 142 is configured on the substrate 110. The first connecting structure 115 is electrically connected to the second semiconductor layer 112 and the second conductive pad 142. In practice, the first connecting structure 115 can be made of conductive material. Furthermore, the material of the first connecting structure 115 also may be Indium Tin Oxide (ITO). As shown in FIG. 2, the first connecting structure 115 can be connected to the top surface of the second semiconductor layer 112. The first conductive pads 141 is a P-electrode, and the second conductive pad 142 is an N-electrode. When the first conductive pads 141 and the second conductive pad 142 receive the electricity, the electricity can pass through the second semiconductor layer 112 and the third semiconductor layer 113 via the top conductive layer 117 and the first connecting structure 115, so that the second light emitting diode 11B formed by the second semiconductor layer 112 and the third semiconductor layer 113 can emit the second light.

In this embodiment, each of the pixels further includes a third conductive pad 143 and a bonding layer 118. The third conductive pad 143 is configured on the substrate 110. The bonding layer 118 is configured between the substrate 110 and the first semiconductor layer 111 and electrically connected to the first semiconductor layer 111 and the third conductive pad 143. In practice, the bonding layer 118 can be a metal layer, and the material of the bonding layer 118 can comprise at least one selected from Au, Sn, In, Ti and Cu. Hence, the third conductive pad 143 can be electrically connected to the first semiconductor layer 111 through the bonding layer 118. Moreover, the third conductive pad 143 is a P-electrode. When the first conductive pad 141 and the third conductive pad 143 receive the electricity, the electricity can pass through the first semiconductor layer 111 and the third semiconductor layer 113 via the top conductive layer 117 and the bonding layer 118, so that the first light emitting diode 11A formed by the first semiconductor layer 111 and the third semiconductor layer 113 can emit the first light. Therefore, the first emitting diode and the second emitting diode can be formed in one pixel of the double color micro LED display panel, and the first emitting diode and the second emitting diode can share the same semiconductor layer, thereby increasing the light emitting efficiency and reducing volume.

The bonding layer is not limited to the metal layer, the bonding layer also can be a non-metallic layer. In one embodiment, the bonding layer is a non-metallic layer and the pixel further includes a conductive layer (not shown in figure). The conductive layer is disposed between the bonding layer and the first semiconductor layer, and the conductive layer is electrically connected to the third conductive pad. In practice, the conductive layer may include conductive material and connect to the third conductive pad through metal wire or plate. Therefore, the electricity also can pass from the third conductive pad to the first semiconductor layer.

In this embodiment, the double color micro LED display panel 1 further includes a plurality of pixel drivers 15 respectively configured on the substrate 110 of the pixels 11. The pixel driver 15 connects to the first conductive pad 141, the second conductive pad 142 and the third conductive pad 143. In practice, the pixel driver 15 can be a controlling chip. The pixel driver 15 can be connected to a power source to receive the electricity of the power source. Furthermore, the pixel driver 15 can selectively apply the electricity to the first conductive pad 141, the second conductive pad 142 and the third conductive pad 143 to control the first light emitting diode 11A and the second light emitting diode 11B to emit lights. For example, when the pixel driver 15 applies a forward bias to the first conductive pad 141 and the second conductive pad 142, and to the first conductive pad 141 and the third conductive pad 143, the first light emitting diode 11A and the second light emitting diode 11B emit the first light and the second light at the same time. When the pixel driver 15 applies a forward bias to the first conductive pad 141 and the second conductive pad 142 and applies a reserve bias to the first conductive pad 141 and the third conductive pad 143, the pixel 11 only emits the second light. Therefore, the double color micro LED display panel 1 can emit at least one light according to different power configurations.

Figure 3:
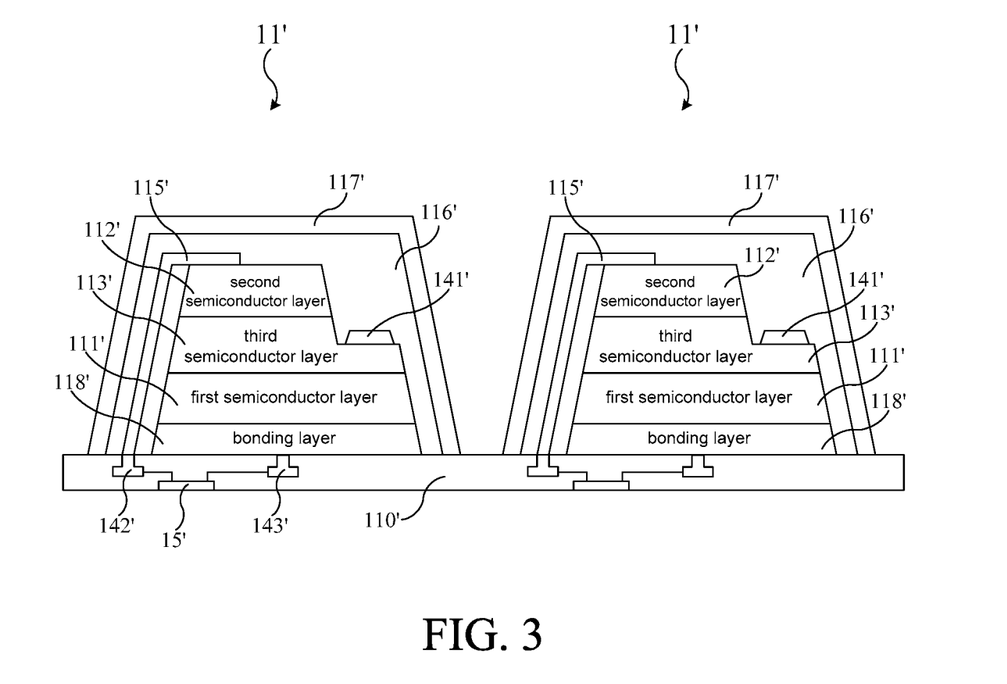
FIG. 3 is a cross-sectional diagram illustrating the two pixels of the double color micro LED display panel according to another embodiment of the present invention.
Figure 4:
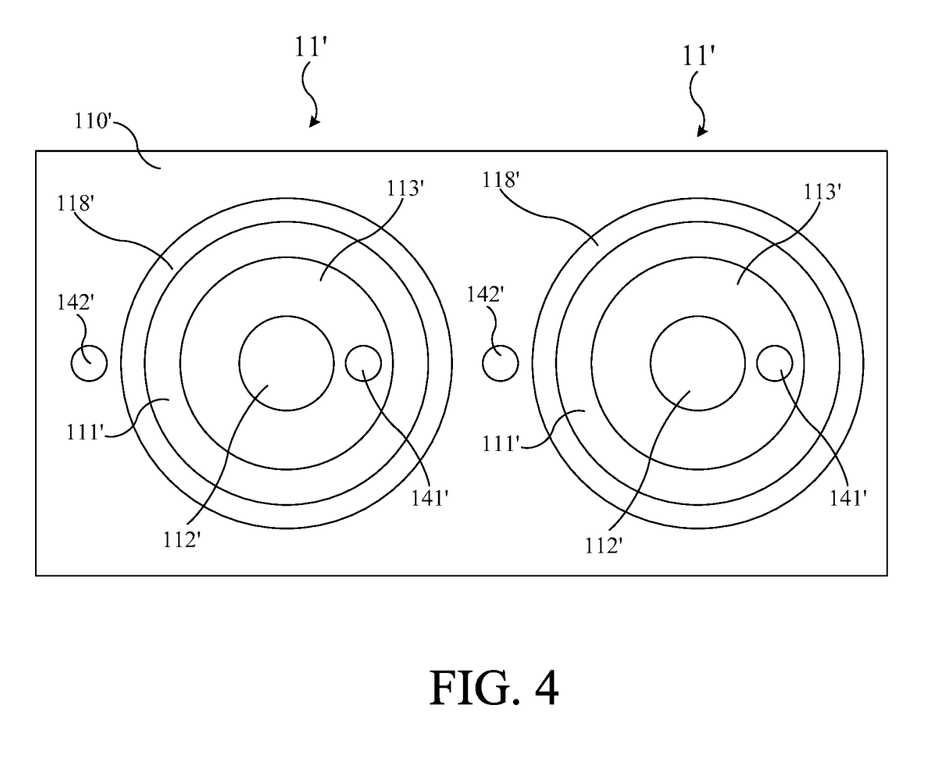
FIG. 4 is a top view diagram illustrating the two pixels of the double color micro LED display panel in FIG. 3.

The configuration of the pixel also can be another form. Please refer to FIG. 3 and FIG. 4. FIG. 3 is a cross-sectional diagram illustrating the two pixels 11' of the double color micro LED display panel according to another embodiment of the present invention. FIG. 4 is a top view diagram illustrating the two pixels 11' of the double color micro LED display panel in FIG. 3. In this embodiment, the first conductive pad 141' is configured on the exposed portion of the third semiconductor layer 113' directly. Furthermore, the top conductive layer 117' does not connect to the third semiconductor layer 113' and does not extend to the top conductive layer 117' of another pixels 11'. In practice, the first conductive pad 141' can be connected to the top conductive layer 117' by conductive component (not shown in the figure), and then the pixel driver 15' connects the top conductive layer 117', the second conductive pad 142' and the third conductive pad 143' to control the first light emitting diode and the second light emitting diode to emit lights. In this embodiment, each of pixel drivers 15' respectively control single pixel 11' of the double color micro LED display panel. In one embodiment, the pixel driver connects the second conductive pad and the third conductive pad, the top conductive layer connects the third semiconductor layer of all pixels in series, and the electricity is applied on the top conductive layer. Therefore, the first conductive pads receive the same electricity, and each pixel driver of the pixels can control the first light emitting diode and the second light emitting diode to emit lights through the second conductive pad and the third conductive pad.

Figure 5:
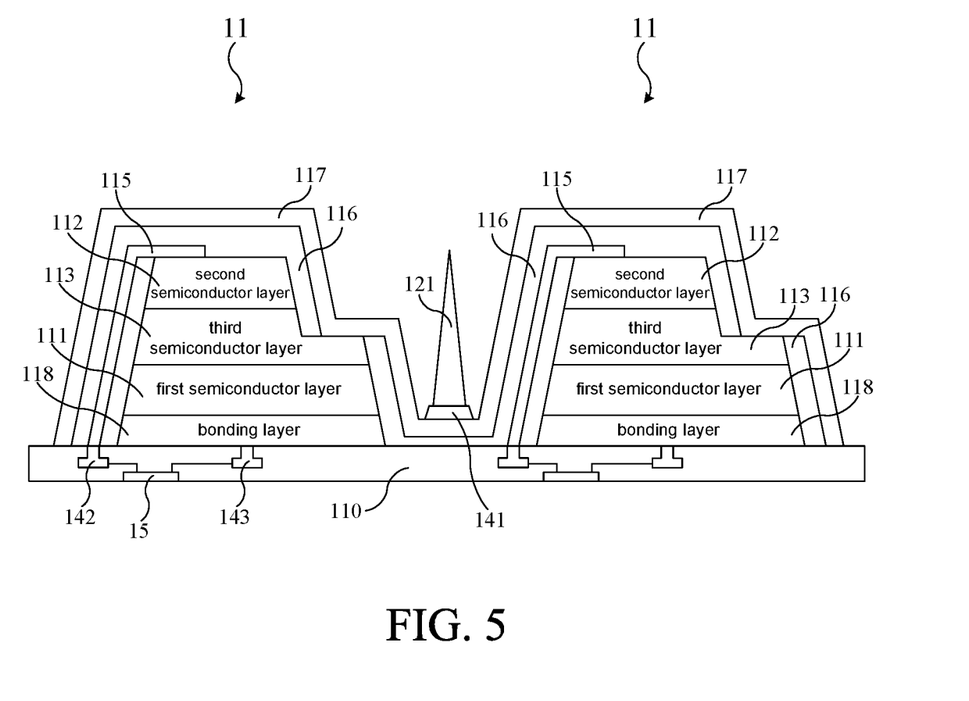
FIG. 5 is a cross-sectional diagram illustrating the two pixels of the double color micro LED display panel according to the embodiment of FIG. 2.

Please refer to FIG. 5. FIG. 5 is a cross-sectional diagram illustrating the two pixels 11 of the double color micro LED display panel according to the embodiment of FIG. 2. In this embodiment, the double color micro LED display panel further includes a plurality of reflective components 121 respectively disposed on the first conductive pads 141. In practice, the reflective component 121 may be a triangular reflective prism. The reflective component 121 can be corresponding to the first light emitting diode and the second light emitting diode. The surface of reflective structure can be formed a reflective layer to reflect the first light and the second light. Therefore, the reflective component 121 can reflect the lights to block the lights emitted from the one of the pixels to another of the pixels, thereby increasing the display efficiency and reducing the light crosstalk. In addition, the reflective component 121 can reflect the first light and the second light to a certain direction according to the angle of the triangular prism. The certain direction can be perpendicular and away from the substrate 110. That is to say, the certain direction is the direction in which the pixel 11 emits light. When the first light and the second light are emitted from the side of the first light emitting diode and the second light emitting diode, the first light and the second light pass through the insulation layer 116 and the top conductive layer 117 to the reflective component 121. Then, the reflective component 121 changes the direction of the first light and the second light in the certain direction. Therefore, the reflective component 121 can change the direction of the first light and the second light to increase the light output rate, thereby increasing the display efficiency.

Figure 6:
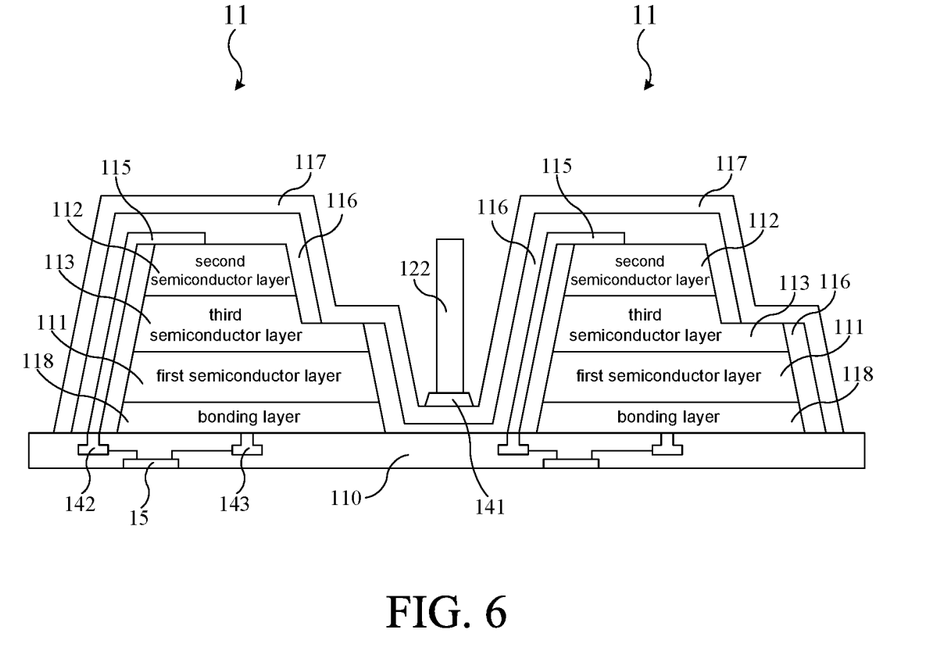
FIG. 6 is a cross-sectional diagram illustrating the two pixels of the double color micro LED display panel according to the embodiment of FIG. 2.

Please refer to FIG. 6. FIG. 6 is a cross-sectional diagram illustrating the two pixels 11 of the double color micro LED display panel according to the embodiment of FIG. 2. In this embodiment, the double color micro LED display panel further includes a plurality of optical isolation components 122 respectively disposed on the first conductive pads 141. In practice, the optical isolation component 122 may include a light absorbing material formed on the surface of the optical isolation component 122. The light absorbing material can absorb the certain wavelength of light or certain color. For example, the first light is a green light, and the second light is a blue light. The optical isolation component 122 can absorb the green light and the blue light. In one embodiment, two light absorbing materials are formed on the different positions of the optical isolation component 122. The green light absorbing material is formed on the portion of the optical isolation component 122 corresponding to the first light emitting diode to absorb the first light, and blue light absorbing material is formed on the portion of the optical isolation component 122 corresponding to the second light emitting diode to absorb the second light. Therefore, the optical isolation component 122 can absorb and block the light emitted from the one of the pixels to another of the pixels to reduce the light crosstalk, thereby increasing the display efficiency and the resolution.

Figure 7:
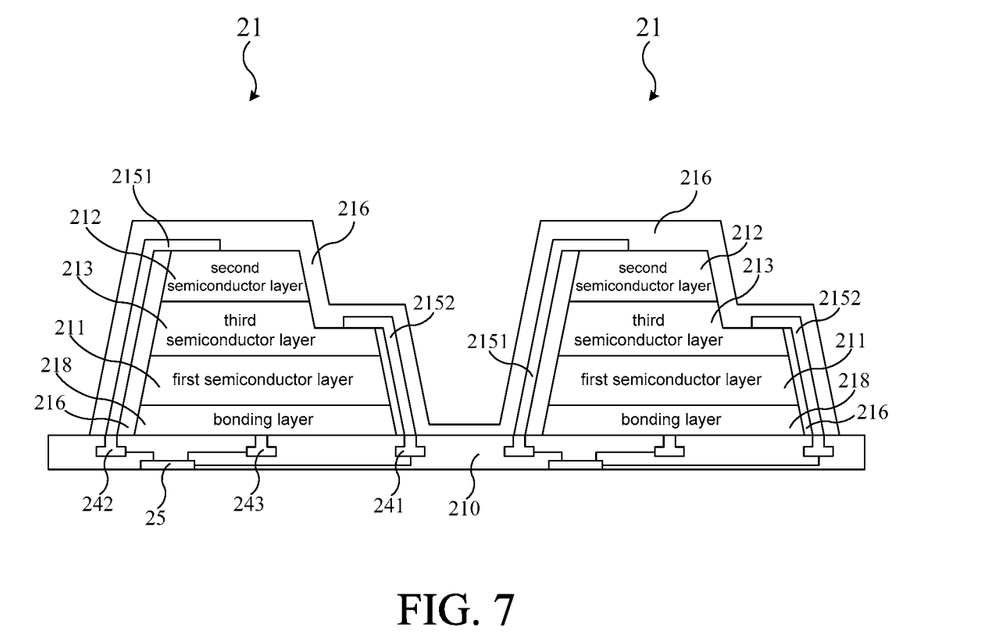
FIG. 7 is a cross-sectional diagram illustrating the two pixels of the double color micro LED display panel according to another embodiment of the present invention.

Please refer to FIG. 7. FIG. 7 is a cross-sectional diagram illustrating the two pixels 21 of the double color micro LED display panel according to another embodiment of the present invention. The difference of this embodiment and the aforementioned embodiment is that the pixels 21 of the double color micro LED display panel do not include the top conductive layer. Furthermore, the first conductive pad 241 is configured on the substrate 210, and the pixel 21 further includes a second connecting structure 2152. As shown in FIG. 7, the first conductive pad 241, the second conductive pad 242 and the third conductive pad 243 are configured on the substrate 210. The first connecting structure 2151 is connected to the second semiconductor layer 212 and the second conductive pad 242, and the second connecting structure 2152 is connected to the third semiconductor layer 213 and the first conductive pad 241. In practice, the material of the second connecting structure 2152 is the same as the first connecting structure 2151. The first conductive pads 241 is a P-electrode, and the second conductive pad 242 and the third conductive pad 243 are N-electrodes. Therefore, the second light emitting diode formed by the second semiconductor layer 212 and the third semiconductor layer 213 can emit the second light.

Furthermore, each of the pixels 21 also can include the bonding layer 218 configured between the substrate 210 and the first semiconductor layer 211 and electrically connected to the first semiconductor layer 211 and the third conductive pad 243. Therefore, the first light emitting diode formed by the first semiconductor layer 211 and the third semiconductor layer 213 can emit the first light. The function of the bonding layer in this embodiment is the same as that of the aforementioned embodiments, it will be not described herein.

Moreover, each of the pixels 21 also can include the pixel driver 25 connected to the first conductive pad 241, the second conductive pad 242 and the third conductive pad 243. Similarly, the pixel driver 25 can selectively apply the electricity to the first conductive pad 241, the second conductive pad 242 and the third conductive pad 243 to control the first light emitting diode and the second light emitting diode to emit lights.

Figure 8:
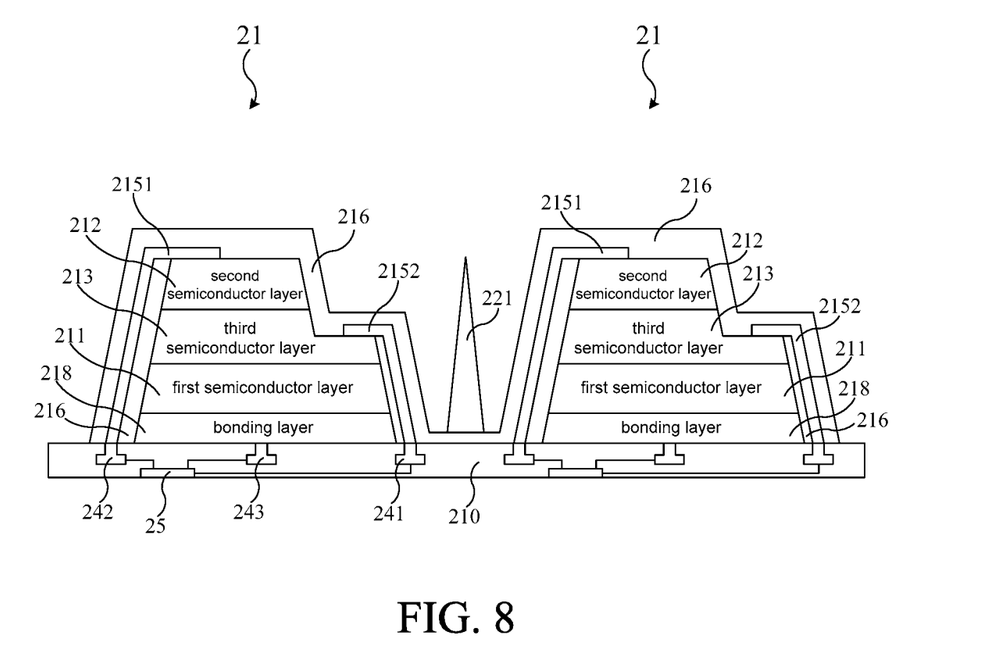
FIG. 8 is a cross-sectional diagram illustrating the two pixels of the double color micro LED display panel according to the embodiment of FIG. 7.
Figure 9:
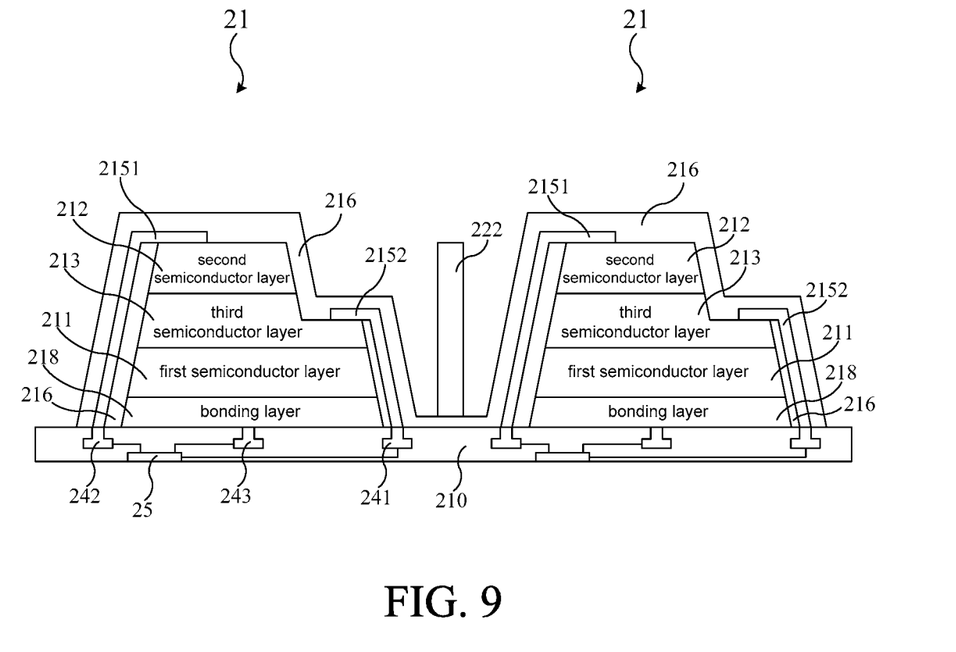
FIG. 9 is a cross-sectional diagram illustrating the two pixels of the double color micro LED display panel according to the embodiment of FIG. 7.

Please refer to FIG. 8. FIG. 8 is a cross-sectional diagram illustrating the two pixels 21 of the double color micro LED display panel according to the embodiment of FIG. 7. In this embodiment, the double color micro LED display panel further includes a plurality of reflective components 221 respectively disposed on the insulation layer 216 between two of the pixels 21 to reflect the first light and the second light emitted from the first light emitting diode and the second light emitting diode to a certain direction. The function of the reflective component 221 in this embodiment is the same as that of the aforementioned embodiments, it will be not described herein. Please refer to FIG. 9. FIG. 9 is a cross-sectional diagram illustrating the two pixels 21 of the double color micro LED display panel according to the embodiment of FIG. 7. In this embodiment, the double color micro LED display panel further includes a plurality of optical isolation components 222 respectively disposed on the insulation layer 216 between two of the pixels 21 to block the first light and the second light emitted from one of the pixels to the other of the pixels. The function of optical isolation component 222 in this embodiment is the same as that of the aforementioned embodiments, it will be not described herein.

Figure 10:
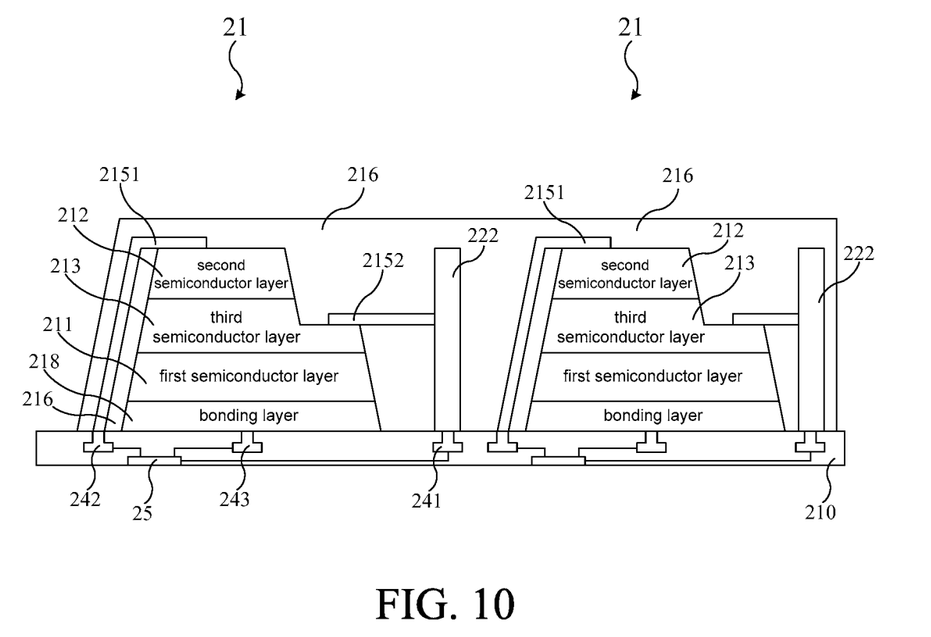
FIG. 10 is a cross-sectional diagram illustrating the two pixels of the double color micro LED display panel according to another one embodiment.

Please refer to FIG. 10. FIG. 10 is a cross-sectional diagram illustrating the two pixels 21 of the double color micro LED display panel according to another one embodiment. In this embodiment, the optical isolation component 222 is configured on the substrate and the isolation layer 216 is configured on the optical isolation component 222. Furthermore, the second connecting structure 2152 connects to the optical isolation component 222, and the optical isolation component 222 connects to the first conductive pad 241. In practice, the material of the optical isolation structure 222 may be a conductive material, and the optical isolation structure 222 includes the light absorbing material formed on the surface of the optical isolation structure 222. The first conductive pad 241 is a P-electrode, and the second conductive pad 242 and the third conductive pad 243 are N-electrodes. It should be noted that the configuration of the second connecting structure is not limited herein. In one embodiment, the first connecting structure and the bonding layer are connected to the optical isolation component, and the optical isolation component connects to the second conductive pad (not shown in figure). Similarly, the position of the optical isolation structure can be change to the reflective component.

In one embodiment, the third semiconductor layer connects to the optical isolation component directly, and the optical isolation component connects to the first conductive pad. In one embodiment, the first semiconductor layer and the second semiconductor layer connect to the optical isolation component directly, and the optical isolation component connects to the second conductive pad. Similarly, the position of the optical isolation structure can be change to the reflective component.

In summary, the double color micro LED display panel of the present invention can include two light emitting diodes which emit different colors in one pixel, thereby increasing the light emitting efficiency and reducing the volume. The reflective component and the optical isolation component can effectively block the light emitted from one pixel to another of pixels to reduce the light crosstalk, thereby increasing the display efficiency and the resolution. Moreover, the reflective component can reflect the lights to increase the light output rate, which improves the display efficiency.

With the examples and explanations mentioned above, the features and spirits of the invention are hopefully well described. More importantly, the present invention is not limited to the embodiment described herein. Those skilled in the art will readily observe that numerous modifications and alterations of the device may be made while retaining the teachings of the invention. Accordingly, the above disclosure should be construed as limited only by the metes and bounds of the appended claims.

What is claimed is:
1. A double color micro LED display panel, comprising:
a plurality of pixels, each of the pixels comprising:

a substrate;

a first semiconductor layer configured on the substrate, the first semiconductor layer being N type;

a second semiconductor layer configured on the first semiconductor layer, the second semiconductor layer being N type;

a third semiconductor layer, configured between the first semiconductor layer and the second semiconductor layer, the third semiconductor layer being P type;

an insulation layer, covering the top surface and side wall of the second semiconductor layer, the side wall of the first semiconductor layer and the third semiconductor layer, and the surface of the substrate, the insulation layer exposing a portion of the third semiconductor layer, the insulation layer extending to the position between two of the pixels; and a top conductive layer configured on the insulation layer and electrically connected to the exposed third semiconductor layer, the top conductive layer extending to the position between two of the pixels; and a plurality of first conductive pads respectively configured on the top conductive layer between two of the pixels and electrically connected to the third semiconductor layer through the top conductive layer;

wherein, the first semiconductor layer and the third semiconductor layer form a first light emitting diode to emit a first light, and the second semiconductor layer and the third semiconductor form a second light emitting diode to emit a second light.

2. The double color micro LED display panel of claim 1, wherein the wavelength of the first light is different from that of the second light.

3. The double color micro LED display panel of claim 2, wherein the first light and the second light are selected from two of red, blue, yellow, green, orange, cyan and purple lights.

4. The double color micro LED display panel of claim 1, further comprising a plurality of reflective components respectively disposed on the first conductive pads and configured to reflect the first light and the second light to a certain direction.

5. The double color micro LED display panel of claim 1, further comprising a plurality of optical isolation components respectively disposed on the first conductive pads and configured to block the first light and the second light emitted from one of the pixels to the other of the pixels.

6. The double color micro LED display panel of claim 1, wherein each of the pixels comprises a second conductive pad and a first connecting structure, the second conductive pad is configured on the substrate, and the first connecting structure is electrically connected to the second semiconductor layer and the second conductive pad.

7. The double color micro LED display panel of claim 6, wherein each of the pixels comprises a third conductive pad configured on the substrate and a bonding layer configured between the substrate and the first semiconductor layer, the bonding layer is electrically connected to the first semiconductor layer and the third conductive pad.

8. The double color micro LED display panel of claim 7, further comprising a plurality of pixel drivers respectively configured on the substrate of the pixels, the pixel driver being electrically connected to the second conductive pad and the third conductive pad, and the pixel driver controlling the first light emitting diode and the second light emitting diode to emit lights respectively.

9. The double color micro LED display panel of claim 7, further comprising a plurality of first conductive pads respectively coupled to the third semiconductor layer of the pixels and a plurality of pixel drivers respectively configured on the substrate of the pixels, the pixel driver being electrically connected to the first conductive pad, the second conductive pad and the third conductive pad, and the pixel driver controlling the first light emitting diode and the second light emitting diode to emit lights respectively.

10. The double color micro LED display panel of claim 1, further comprising a plurality of reflective components respectively disposed on the insulation layer between two of the pixels and configured to reflect the first light and the second light to a certain direction.

11. The double color micro LED display panel of claim 1, further comprising a plurality of optical isolation components respectively disposed on the insulation layer between two of the pixels and configured to block the first light and the second light emitted from one of the pixels to the other of the pixels.

12. The double color micro LED display panel of claim 1, wherein each of the pixels comprises a first conductive pad, a second conductive pad, a first connecting structure and a second connecting structure, the first conductive pad and the second conductive pad are configured on the substrate, the first connecting structure is electrically connected to the second semiconductor layer and the second conductive pad, and the second connecting structure is electrically connected to the third semiconductor layer and the first conductive pad.

13. The double color micro LED display panel of claim 12, wherein each of the pixels comprises a third conductive pad configured on the substrate and a bonding layer configured between the substrate and the first light emitting diode, the bonding layer is electrically connected to the first semiconductor layer and the third conductive pad.

14. The double color micro LED display panel of claim 13, further comprising a plurality of pixel drivers respectively configured on the substrate of the pixels, the pixel driver being electrically connected to the first conductive pad, the second conductive pad and the third conductive pad, and the pixel driver controlling the first light emitting diode and the second light emitting diode to emit lights respectively.

15. The double color micro LED display panel of claim 1, wherein the area of the first light emitting diode is larger than that of the second light emitting diode.

* * * * *